US012448680B2

(12) United States Patent
Park et al.

(10) Patent No.: US 12,448,680 B2
(45) Date of Patent: Oct. 21, 2025

(54) METHOD OF FORMING PATTERN STRUCTURE INCLUDING SILICON NITRIDE

(71) Applicant: SEMES CO., LTD., Chungcheongnam-do (KR)

(72) Inventors: Jihoon Park, Chungcheongnam-do (KR); Wan Jae Park, Chungcheongnam-do (KR); Seong Gil Lee, Chungcheongnam-do (KR); Dong Sub Oh, Chungcheongnam-do (KR); Hye Joon Kheel, Chungcheongnam-do (KR); Yun Woo Kim, Chungcheongnam-do (KR); Da Yeong Jeong, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 153 days.

(21) Appl. No.: 18/520,621

(22) Filed: Nov. 28, 2023

(65) Prior Publication Data

US 2024/0209497 A1 Jun. 27, 2024

(30) Foreign Application Priority Data

Dec. 27, 2022 (KR) ........................ 10-2022-0186480

(51) Int. Cl.

| | |
|---|---|
| ***C23C 16/04*** | (2006.01) |
| ***C23C 16/34*** | (2006.01) |
| ***C23C 16/56*** | (2006.01) |

(52) U.S. Cl.

CPC .......... *C23C 16/045* (2013.01); *C23C 16/345* (2013.01); *C23C 16/56* (2013.01)

(58) Field of Classification Search

CPC ..... C23C 16/045; C23C 16/345; C23C 16/56; C23C 16/50; H01L 21/31116;

(Continued)

(56) References Cited

U.S. PATENT DOCUMENTS

| | | |
|---|---|---|
| 9,023,700 B2 | 5/2015 | Ganguly et al. |
| 12,112,954 B2 | 10/2024 | Tomura |

(Continued)

FOREIGN PATENT DOCUMENTS

| | | |
|---|---|---|
| KR | 10-2013-0029056 A | 3/2013 |
| KR | 10-2019-0130044 A | 11/2019 |

(Continued)

OTHER PUBLICATIONS

Korean Office Action issued in corresponding KR Patent Application No. 10-2022-0186480, dated Jul. 23, 2024, with English translation.

*Primary Examiner* — Michael G Miller

(74) *Attorney, Agent, or Firm* — Carter, DeLuca & Farrell LLP

(57) ABSTRACT

Disclosed are a method of forming a pattern structure including a silicon nitride. According to the embodiment of the present disclosure, the method of forming a pattern structure includes a step of providing, into a substrate processing apparatus, a substrate having one surface on which a pattern structure including a recess region in which an opening periphery portion and a bottom portion are made of a first silicon nitride is formed, a deposition step of depositing a second silicon nitride on the first silicon nitride, an etching step of etching the second silicon nitride, and a step of performing steps in one cycle n times until the first silicon nitride constituting the bottom portion is removed.

20 Claims, 11 Drawing Sheets

H1
13a
12
H3
13b
11
10

(58) Field of Classification Search
CPC ........... H01L 21/0217; H01L 21/02274; H01L 21/76802; H01L 21/31144; H01L 21/02211; H01J 37/32357
See application file for complete search history.

(56) References Cited

U.S. PATENT DOCUMENTS

| | | | |
|---|---|---|---|
| 2018/0294144 | A1 | 10/2018 | Aubuchon et al. |
| 2020/0058498 | A1 | 2/2020 | Crook et al. |
| 2021/0233778 | A1* | 7/2021 | Tomura ............. H01L 21/32055 |
| 2022/0235462 | A1 | 7/2022 | Ueda et al. |

FOREIGN PATENT DOCUMENTS

| | | | |
|---|---|---|---|
| KR | 10-2020-0020647 | A | 2/2020 |
| KR | 10-2021-0097044 | A | 8/2021 |
| KR | 10-2022-0107945 | A | 8/2022 |

* cited by examiner

METHOD OF FORMING PATTERN STRUCTURE INCLUDING SILICON NITRIDE

CROSS-REFERENCE TO RELATED PATENT APPLICATION

This application claims the benefit of Korean Patent Application No. 10-2022-0186480, filed on Dec. 27, 2022, in the Korean Intellectual Property Office, the disclosure of which is incorporated herein in its entirety by reference.

BACKGROUND OF THE DISCLOSURE

1. Field of the Disclosure

The present disclosure relates to a method of manufacturing a semiconductor device, and more particularly, to a method of forming a pattern structure including a silicon nitride among pattern structures constituting a semiconductor device.

2. Description of the Related Art

In order to manufacture a semiconductor device, a process of depositing a material layer including electrical conductors and insulators on one surface of a substrate and selectively etching a particular region of the deposited material layer is repeatedly performed to form pattern structures having various shapes. A recess region having an empty space may be formed in a partial region of the pattern structure. For example, the recess region may be formed by selectively removing a part of the material layer downward from a top surface of a material. The recess region may have a hole shape or a trench shape formed in the partial region of the material layer. The recess region includes an opening portion opened upward, an empty space formed downward from the opening portion, and a bottom portion that is a region in which the empty space is terminated. The opening portion is limited by the top surface of the material layer. Therefore, a peripheral portion (hereinafter, referred to as an "opening periphery portion"), which surrounds the opening portion, corresponds to the top surface of the material layer.

During the process of manufacturing the semiconductor device, only the bottom portion sometimes needs to be selectively etched without etching the opening periphery portion. For example, FIG. 10 illustrates a pattern structure in which lateral and top portions of conductive patterns 1100 are surrounded by silicon nitrides 1200 and 1300.

With reference to FIG. 10, the conductive pattern 1100 is formed on a top portion of a silicon substrate 1000, and the lateral and top portions of the conductive pattern 1100 are surrounded by a first silicon nitride 1200. The conductive pattern 1100 may include a metallic line, e.g., a bit line made of tungsten to conduct electricity. A recess region R is formed between the first silicon nitrides 1200 defining a concave-convex shape.

With reference to FIG. 10, a top surface T of the first silicon nitride 1200 formed on the top portion of the conductive pattern 1100 constitutes an opening periphery portion of the recess region R. In addition, a bottom portion B of the recess region R corresponds to a top surface of a second silicon nitride 1300. In some instances, it is necessary to selectively remove the second silicon nitride 1300 on the bottom portion B without etching the first silicon nitride 1200 on the opening periphery portion. That is, only the bottom portion B of the opening portion region R is selectively etched without etching the opening periphery portion of the recess region R.

When the etching process is performed to remove the second silicon nitride 1300 on the bottom portion B, the top region T of the first silicon nitride 1200 is exposed to an etching gas, such that the top region T of the first silicon nitride 1200 is also etched. Therefore, when the etching process is ended, a height of the first silicon nitride 1200 formed on the top portion of the conductive pattern 1100 is decreased. This means that a thickness of the first silicon nitride 1200 formed on the top portion of the conductive pattern 1100 further decreases than a designed thickness during the manufacturing process, and the decrease in thickness may be a factor that affects an operation of the semiconductor device later.

Therefore, a lithography process using a photosensitive film may be considered to selectively etch the second silicon nitride 1300. However, it is very difficult to apply the lithography process because the pattern structure having the concave-convex shape including the recess region is already formed. Accordingly, there is a need for a technology for selectively etching the second silicon nitride 1300 constituting the bottom portion B without etching the opening periphery portion T that is the top surface of the first silicon nitride 1200.

SUMMARY OF THE DISCLOSURE

A technical object of the present disclosure is to provide a method of selectively etching a bottom portion of a recess region without etching an opening periphery portion of the recess region in the recess region included in a pattern structure constituting a semiconductor device. However, the object of the present disclosure is illustrative, and the technical spirit of the present disclosure is not limited by the object.

One aspect of the present disclosure provides a method of forming a pattern structure including a silicon nitride.

According to the embodiment of the present disclosure, the method of forming a pattern structure includes: a step of providing, into a substrate processing apparatus, a substrate having one surface on which a pattern structure including a recess region in which an opening periphery portion and a bottom portion are made of a first silicon nitride is formed; step (a1) a deposition step of depositing a second silicon nitride on the first silicon nitride so that a deposition thickness on the bottom portion has a smaller value than a deposition thickness on the opening periphery portion; step (b1) an etching step of etching the second silicon nitride on the opening periphery portion by the thickness deposited in step (a1), etching and removing the second silicon nitride deposited in step (a1) on the bottom portion, and etching the first silicon nitride provided below the second silicon nitride; and a step of performing steps (a1) and (b1) in one cycle n times (n is a natural number equal to or larger than 1) until the first silicon nitride constituting the bottom portion is removed.

According to the embodiment of the present disclosure, the pattern structure may further include a conductive pattern having lateral and top portions surrounded by the first silicon nitride.

According to the embodiment of the present disclosure, the deposition step in step (a1) may be performed as plasma-enhanced chemical vapor deposition using a silicon precursor gas and a nitrogen precursor gas.

According to the embodiment of the present disclosure, the silicon precursor gas may include $SiH_4$, and the nitrogen precursor gas may include any one of or both $N_2$ and $NH_3$.

According to the embodiment of the present disclosure, a process pressure of the substrate processing apparatus in the deposition step may be within a range of 100 to 500 mTorr.

According to the embodiment of the present disclosure, plasma generation power in the deposition step may be within a range of 100 to 400 W.

According to the embodiment of the present disclosure, a deposition thickness of the second silicon nitride in the deposition step in step (a1) may be within a range of 30 to 100 Å.

According to the embodiment of the present disclosure, the etching step in step (b1) may be performed by using plasma of an etching gas. In this case, the etching gas may include $NF_3$ gas and $NH_3$ gas. In addition, a process pressure in the etching step may be within a range of 20 to 50 mTorr.

According to the embodiment of the present disclosure, an aspect ratio of the recess region may be within a range of 5 to 15.

According to the embodiment of the present disclosure, the pattern structure may further include a layer made of a silicon oxide formed below the bottom portion, and the method may further include: after the removal of the first silicon nitride on the bottom portion, step (c1) a deposition step of depositing the second silicon nitride on the first silicon nitride so that the deposition thickness on the bottom portion has a smaller value than the deposition thickness on the opening periphery portion; step (d1) an etching step of etching the second silicon nitride on the opening periphery portion by the thickness deposited in step (c1), etching and removing the second silicon nitride deposited in step (c1) on the bottom portion, and etching the silicon oxide provided below the second silicon nitride; and a step of performing steps (c1) and (d1) in one cycle n times (n is a natural number equal to or larger than 1).

According to the embodiment of the present disclosure, the step of etching the silicon oxide in step (d1) may be performed under an etching condition in which an etching selection ratio (ER1/ER2) made by dividing an etching rate ER1 for the silicon nitride by an etching rate ER2 for the silicon oxide is within a range of 0.8 to 1.2.

According to the embodiment of the present disclosure, the step of etching the silicon oxide may be performed until the silicon oxide is removed.

According to the embodiment of the present disclosure, the etching step in step (d1) may be performed by using a radical including fluorine and derived from remote plasma generated by using an etching gas in a remote plasma generation part of the substrate processing apparatus.

According to the embodiment of the present disclosure, the etching gas may include $NF_3$, $H_2$, and $NH_3$.

According to the embodiment of the present disclosure, a process pressure in the etching step may be within a range of 3,000 to 5,000 mTorr.

According to another embodiment of the present disclosure, a method of forming a pattern structure includes: a step of providing, into a substrate processing apparatus, a substrate having one surface on which a pattern structure including a recess region in which an opening periphery portion and a bottom portion are made of a first silicon nitride is formed; step (a2) a deposition step of depositing a second silicon nitride on the first silicon nitride so that the second silicon nitride is deposited on the opening periphery portion, and the second silicon nitride is not deposited on the bottom portion; step (b2) an etching step of etching the second silicon nitride on the opening periphery portion by a thickness deposited in step (a2) and etching the first silicon nitride on the bottom portion; and a step of performing steps (a2) and (b2) in one cycle n times (n is a natural number equal to or larger than 1) until the first silicon nitride on the bottom portion is removed.

According to the embodiment of the present disclosure, the pattern structure may further include a layer made of a silicon oxide formed below the bottom portion, and in which the method of forming a pattern structure may further include: after the removal of the first silicon nitride on the bottom portion, step (c2) a deposition step of depositing the second silicon nitride on the first silicon nitride so that the second silicon nitride is deposited on the opening periphery portion, and the second silicon nitride is not deposited on the bottom portion; step (d2) an etching step of etching the second silicon nitride on the opening periphery portion by a thickness deposited in step (a2) and etching the silicon oxide on the bottom portion; and a step of performing steps (c2) and (d2) in one cycle n times (n is a natural number equal to or larger than 1).

According to still another embodiment of the present disclosure, a method of forming a pattern structure including a silicon nitride includes: a step of providing, into a substrate processing apparatus, a substrate having one surface on which a pattern structure including a recess region, in which an opening periphery portion and a bottom portion are made of a first silicon nitride, and including a layer formed below the recess region and made of a silicon oxide is formed; step (a) a deposition step of depositing a second silicon nitride on the first silicon nitride so that the second silicon nitride is deposited or not deposited so that a deposition thickness on the bottom portion has a smaller value than a deposition thickness on the opening periphery portion; step (b) an etching step including a step of etching the second silicon nitride on the opening periphery portion by the thickness deposited in step (a) and etching the first silicon nitride on the bottom portion; a step of performing steps (a) and (b) in one cycle n times (n is a natural number equal to or larger than 1) until the first silicon nitride on the bottom portion is removed; step (c) a deposition step of depositing the second silicon nitride on the first silicon nitride so that the second silicon nitride is deposited or not deposited so that the deposition thickness on the bottom portion has a smaller value than the deposition thickness on the opening periphery portion; step (d) an etching step of etching the first silicon nitride by a first thickness and etching the silicon oxide under the bottom portion; and a step of performing steps (c) and (d) in one cycle n times (n is a natural number equal to or larger than 1) until the silicon oxide under the bottom portion is removed, in which the step of etching the silicon oxide in step (d) is performed as an etching process using a radical including fluorine under an etching condition in which an etching selection ratio (ER1/ER2) made by dividing an etching rate ER1 for the silicon nitride by an etching rate ER2 for the silicon oxide is within a range of 0.8 to 1.2, and in which a process pressure is within a range of 3,000 to 5,000 mTorr.

According to the technical spirit of the present disclosure, it is possible to provide the method of selectively etching the silicon nitride on the bottom portion without etching the silicon nitride on the opening periphery portion in the recess region included in the pattern structure constituting the semiconductor device. However, the scope of the present disclosure is not limited by the effect.

BRIEF DESCRIPTION OF THE DRAWINGS

The above and other purposes, features and other advantages of the present disclosure will be more clearly understood from the following detailed description taken in conjunction with the accompanying drawings, in which.

DETAILED DESCRIPTION OF THE DISCLOSURE

Figure 1:
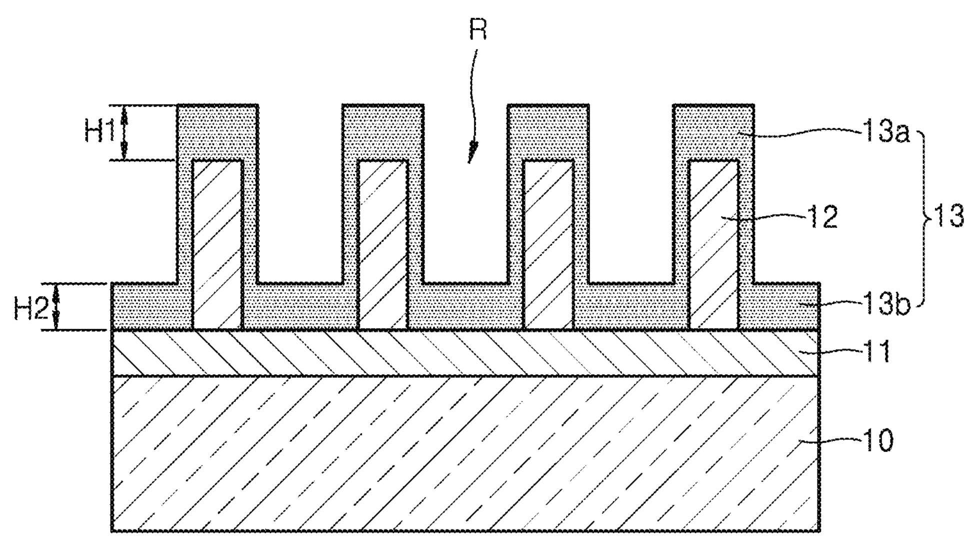
FIGS. 1 to 6 is a view illustrating a method of forming a pattern structure according to a first embodiment of the present disclosure in a stepwise manner.

Hereinafter, various preferred embodiments of the present disclosure will be described in detail with reference to the attached drawings.

The embodiments of the present disclosure are provided to more completely describe the present disclosure for those skilled in the art. The following embodiments may be modified in various forms, and the scope of the present disclosure is not limited to the following embodiments. Rather, these embodiments are provided so that the present disclosure is thorough and complete, and are provided to fully convey the spirit of the present disclosure to those skilled in the art. Furthermore, a thickness or a size of each layer in the drawing is exaggerated for convenience and clarity of illustration. A shape, a size, a ratio, an angle, a number, etc. disclosed in the drawings for describing embodiments of the present disclosure are illustrative, and the present disclosure is not limited thereto. The same reference numerals refer to the same elements herein.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof.

Hereinafter, embodiments of the present disclosure will be described with reference to drawings schematically showing ideal embodiments of the present disclosure. In the drawings, variations of a depicted shape may be expected, depending, for example, on manufacturing techniques and/or tolerances. Therefore, the embodiments of the present disclosure should not be construed as being limited to the specific shape of the area shown herein, and should include, for example, change in a shape caused in a manufacturing process.

FIGS. 1 to 6 is a view illustrating a method of forming a pattern structure according to a first embodiment of the present disclosure in a stepwise manner.

FIG. 1 illustrates a pattern structure in which a silicon nitride is provided on one surface of a substrate 10. The pattern structure described below is exemplarily provided to describe the technical spirit of the present disclosure, and the present disclosure is not limited thereto.

A layer 11 made of a silicon oxide is formed on a top portion of the substrate 10, and a pattern structure including conductive patterns 12 and a first silicon nitride 13 is formed on a top portion of the layer 11. Specifically, the conductive patterns 12 are formed on the silicon oxide layer 11 and spaced apart from one another at predetermined distances. The silicon nitride 13 surrounds lateral and top portions of the conductive patterns 12. The conductive pattern 12 may include a metallic line, e.g., a bit line made of tungsten to conduct electricity. The first silicon nitride 13 is disposed to correspond to the conductive patterns 12 defining a concave-convex shape, and recess regions R are formed in spaces between the conductive patterns 12. The recess region R includes an opening portion opened upward, an empty space formed downward from the opening portion, and a bottom portion that is a region in which the empty space is terminated.

A first silicon nitride 13*a* having a thickness H1 is deposited on a top portion of the conductive pattern 12. A top surface of the first silicon nitride 13*a* having the thickness H1 and formed on the top portion of the conductive pattern 12 corresponds to an opening periphery portion. The bottom portion is also configured as a first silicon nitride 13*b*. The bottom portion corresponds to a top surface of the first silicon nitride 13*b* having a thickness H2. The first silicon nitride 13*b*, which constitutes the bottom portion, is a portion to be selectively removed.

Figure 2:
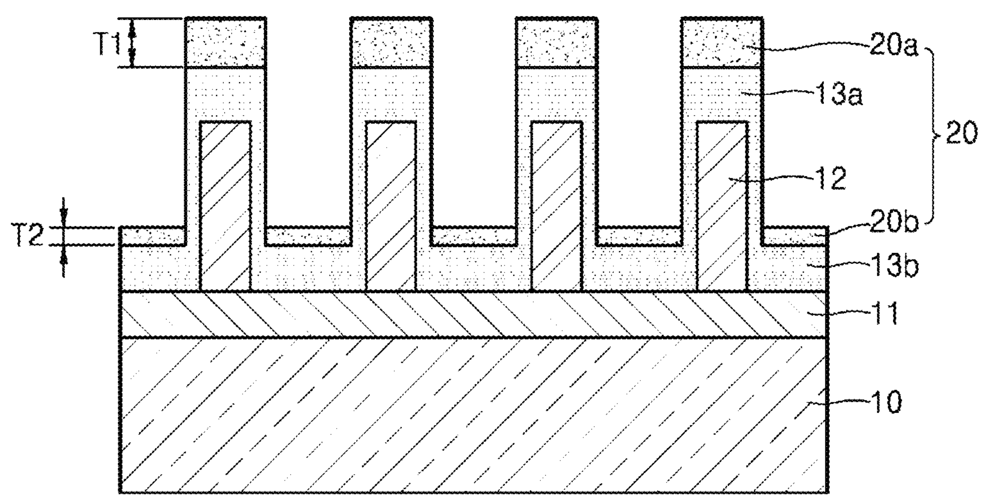

With reference to FIG. 2, a second silicon nitride 20 is deposited on the first silicon nitride 13. In this case, the deposition is performed so that a thickness T2 of a second silicon nitride 20*b*, which is deposited on the top surface of the first silicon nitride 13*b* constituting the bottom portion, has a smaller value than a thickness T1 of a second silicon nitride 20*a* deposited on the top surface of the first silicon nitride 13*a* corresponding to the opening periphery portion. To this end, a deposition rate may be adjusted by controlling a deposition condition for the silicon nitride so that a deposition rate for the bottom portion has a smaller value than a deposition rate for the opening periphery portion. In the deposition step, the thickness T1 of the second silicon nitride 20*a* deposited on the opening periphery portion may be within a range of 30 to 100 Å, for example.

Figure 3:
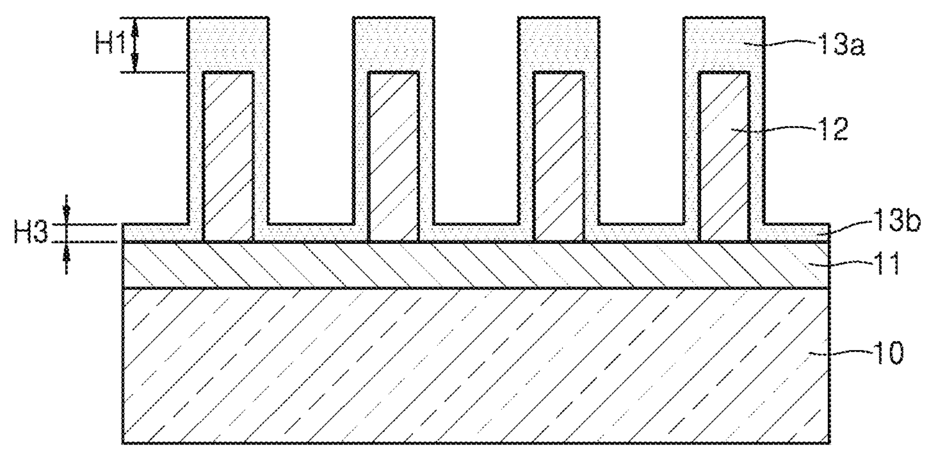

With reference to FIG. 3, the deposited second silicon nitride is removed by performing an etching process overall after the second silicon nitride is deposited. In the present etching step, the etching process is performed by the thickness T1 of the second silicon nitride 20*a* deposited on the opening periphery portion. Therefore, when the present etching step is completed, the second silicon nitride (i.e., reference numeral 20*a* in FIG. 1) deposited on the opening periphery portion is completely removed. In this case, because the thickness T2 of the second silicon nitride 20*b* on the bottom portion has a smaller value than the thickness T1, the second silicon nitride 20*b* on the bottom portion is completely removed in a condition in which the second silicon nitride is etched by the thickness T1. The first silicon nitride 13*b* provided below the second silicon nitride 20*b* is also etched after the second silicon nitride 20*b* is removed.

The first and second silicon nitrides are made of the same material and etched at the same etching rate. Therefore, the first silicon nitride 13*b*, which has been provided below the second silicon nitride 20*b*, is etched at the same etching rate immediately after the second silicon nitride 20*b* on the bottom portion is etched and removed completely.

Therefore, after the present etching step is ended, the opening periphery portion is not substantially etched, such that the thickness H1 of the top portion of the conductive pattern 12 is maintained in an intact manner without being changed in comparison with a state made before the etching process. In contrast, the first silicon nitride 13*b* on the bottom portion is etched, such that after the etching process is ended, a thickness H3 of the first silicon nitride 13*b* on the bottom portion has a smaller value than the thickness H2 in a state made before the etching process. That is, in the present etching step, the first silicon nitride 13*b* on the bottom portion may be selectively etched and removed without etching the first silicon nitride 13*a* constituting the opening periphery portion.

Figure 4:
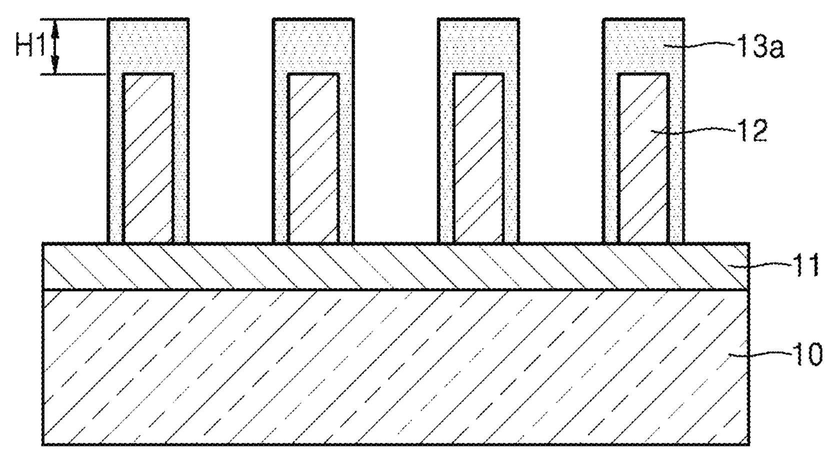

The deposition step and the etching step for the second silicon nitride is performed in one cycle, and the deposition step and the etching step are performed n times (n is a natural number equal to or larger than 1) until the first silicon nitride 13*b* on the bottom portion is removed completely. FIG. 4 illustrates a state in which the first silicon nitride 13*b* on the bottom portion is removed completely. As illustrated in FIG. 4, the thickness H1 of the first silicon nitride 13*a* on the top portion of the conductive pattern 12 is maintained in an intact manner without being changed. After the first silicon nitride constituting the bottom portion is removed completely, the silicon oxide layer 11, which has been provided below the first silicon nitride, constitutes the bottom portion.

After the first silicon nitride on the bottom portion is removed completely, a step of removing the silicon oxide layer 11, which has been provided below the first silicon nitride, may be performed. In this case, this step is similar to the above-mentioned method in that the deposition step and the etching step are repeatedly performed in one cycle n times. However, this step may be different from the above-mentioned method in the state before the process condition in the etching step.

Figure 5:
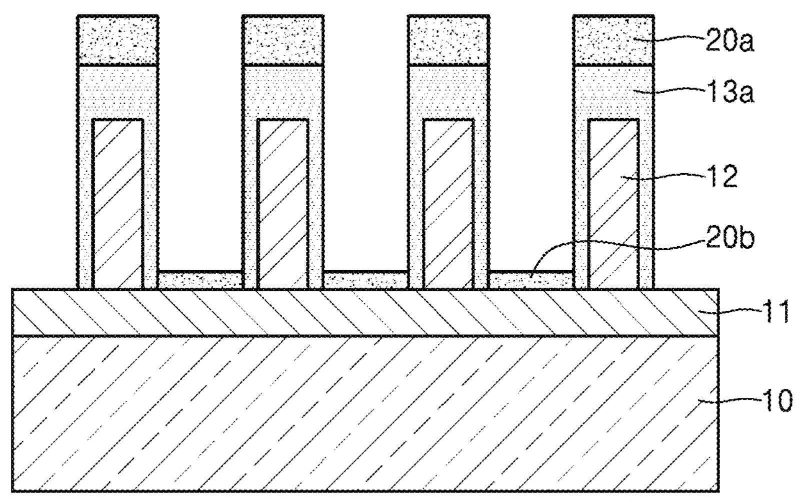

With reference to FIG. 5, the second silicon nitride 20 is deposited on the first silicon nitride 13. In this case, this step is similar to the step illustrated in FIG. 2 in that the thickness of the second silicon nitride 20*b* deposited on the bottom portion has a smaller value than the thickness of the second silicon nitride 20*a* deposited on the opening periphery portion.

After the second silicon nitride 20 is deposited, the etching process is performed by the thickness of the second silicon nitride 20*a* deposited on the opening periphery portion. In this case, the second silicon nitride 20*b* on the bottom portion is completely etched, and the silicon oxide layer 11, which has been provided below the second silicon nitride 20*b*, is exposed. Because the silicon nitride and the silicon oxide are different types of materials, the etching process is not smoothly performed in case that the silicon oxide is etched under a typical etching condition for the silicon nitride. Therefore, in the present etching step, even after the second silicon nitride is removed, the etching condition needs to be controlled so that the silicon oxide may be etched at a level substantially similar or equal to a level of the etching rate for the silicon nitride.

Therefore, the etching step in the present embodiment is performed under an etching condition in which an etching selection ratio (ER1/ER2) made by dividing an etching rate ER1 for the silicon nitride by an etching rate ER2 for the silicon oxide is within a range of 0.8 to 1.2. For example, in case that the etching selection ratio (ER1/ER2) remains the same as 1, the silicon oxide layer 11 is etched at the same etching rate as the second silicon nitride 20*b* even after the second silicon nitride 20*b* on the bottom portion is removed.

Figure 6:
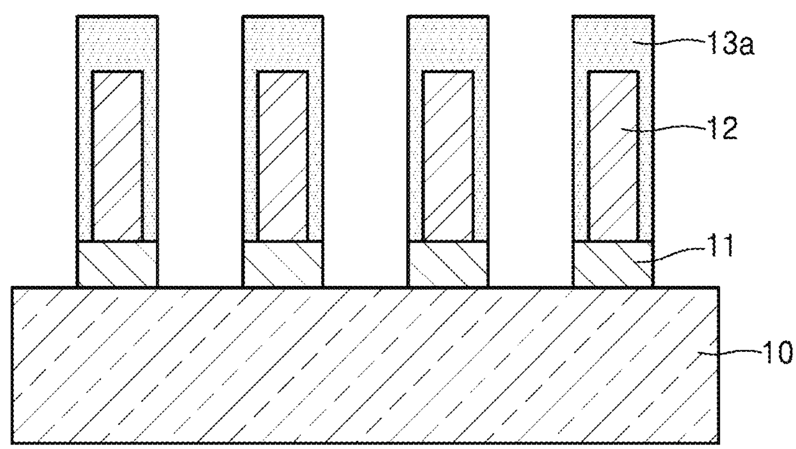

The deposition step and the etching step for the second silicon nitride are repeatedly performed in one cycle n times (n is a natural number equal to or larger than 1) until the silicon oxide on the bottom portion is removed completely. FIG. 6 illustrates a state in which the silicon oxide layer 11, which has constituted the bottom portion, is removed completely in a state in which the thickness H1 of top portion of the conductive pattern 12 is maintained in an intact manner without being changed.

Figure 11:
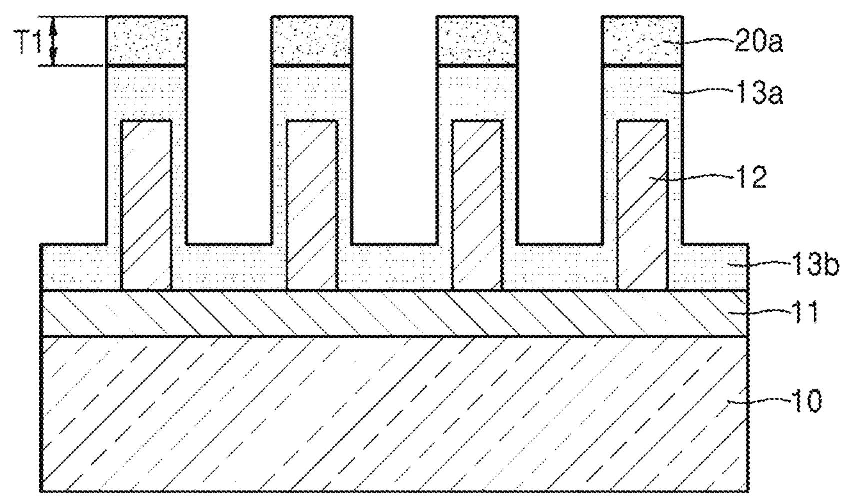
FIG. 11 is a view illustrating a state in which a second silicon nitride is deposited on the pattern structure in FIG. 1 according to the embodiment of the present disclosure.

In a second embodiment of the present disclosure, a step of depositing the second silicon nitride on the first silicon nitride is a step of depositing the second silicon nitride 20*a* on the opening periphery portion without depositing the second silicon nitride on the bottom portion. FIG. 11 illustrates a state in which the second silicon nitride 20*a* is deposited only on the opening periphery portion of the pattern structure in FIG. 1 without being deposited on the bottom portion according to the present embodiment.

In case that an aspect ratio of the recess region is high, it is possible to prevent the deposition by substantially not supplying a precursor gas, which is used as a raw material for the deposition, to the bottom portion by appropriately controlling the deposition condition for the silicon nitride.

The second embodiment is substantially identical to the first embodiment, except that the second silicon nitride is not deposited on the bottom portion in the step of depositing the second silicon nitride and thus the first silicon nitride or the silicon oxide is immediately etched without etching the second silicon nitride on the bottom portion when the step of etching the second silicon nitride is performed. Therefore, the repeated description will be omitted.

The silicon nitride deposition process of the present disclosure may be performed as plasma-enhanced chemical vapor deposition using a silicon precursor gas and a nitrogen precursor gas. The plasma-enhanced chemical vapor deposition refers to a process of depositing a solid film on a substrate by means of a reaction between precursor gases by inputting a plurality of precursor gases into a chamber in which a vacuum ambiance may be established and generating plasma from the precursor gases in the chamber by using a plasma generation device. In the process of forming the silicon nitride by using the plasma-enhanced chemical vapor deposition, the silicon precursor gas may include $SiH_4$ as a gas including a silicon element (Si). In addition, the nitrogen precursor gas may include any one of or both $N_2$ and $NH_3$ as a gas including a nitrogen element (N). Ar or He may be further included as a carrier gas.

The deposition step needs to be performed so that the second silicon nitride has a smaller thickness than the top portion as the second silicon nitride is deposited on the bottom portion at a lower deposition rate than on the top portion of the first silicon nitride. In order to implement the above-mentioned condition, a process pressure in the chamber may be maintained to be a particular value or more during the deposition process using the plasma-enhanced chemical vapor deposition. An overall reaction amount between the precursor gases increases when the process pressure in the chamber increases during the deposition process. Therefore, the amount of production of the silicon nitride increases, and the deposition rate increases on the top surface of the first silicon nitride having a flat structure. However, in the case of the bottom portion, the increase in process pressure may reduce the deposition rate.

That is, the recess region includes the opening portion that is an inlet formed in the top surface of the first silicon nitride, the empty space formed downward from the opening portion, and the bottom portion that is the region in which the empty space is terminated. The precursor gases need to be supplied to and reach the bottom portion so that the deposition process is performed on the bottom portion. In case that the process pressure increases in the deposition step, a mean free path of precursor gas atoms used for the process is shortened, which makes it difficult for the precursor gas atoms to reach the bottom portion. This means a decrease in deposition rate for the bottom portion.

The deposition rate for the bottom portion is also affected by the aspect ratio of the recess region. The aspect ratio refers to a value made by dividing a depth from the opening portion to the bottom portion by a diameter of the opening portion of the recess region. The high aspect ratio means that the empty space of the recess region has a small inlet and a large depth. Therefore, as the aspect ratio increases, the deposition process becomes difficult to perform on the bottom portion. For example, the aspect ratio of the recess region may be within a range of 5 to 15.

In a condition in which the aspect ratio of the recess region is high and the process pressure of the deposition process is high, the deposition rate may remarkably decrease or the deposition may not be substantially performed on the bottom portion in comparison with the opening periphery portion.

In case that the deposition step is performed as the plasma-enhanced chemical vapor deposition using the precursor gases in the process according to the embodiment of the present disclosure, for example, the process pressure may be within a range of 100 to 500 mTorr, plasma generation power may be within a range of 100 to 400 W, a temperature of a susceptor on which the substrate is supported may be within a range of 50 to 200° C.

The etching step may be performed by using plasma of an etching gas for etching the silicon nitride. For example, the etching gas may include $NF_3$ gas and $NH_3$ gas. In addition, an inert gas such as He or Ar may be further included as the carrier gas.

In the present disclosure, in order to simultaneously etch the first silicon nitride and the silicon oxide in the etching step, the etching condition may be controlled so that the etching selection ratio (ER1/ER2) is within a range of 0.8 to 1.2.

In this case, the step of simultaneously etching the first silicon nitride and the silicon oxide may be performed by a radical including fluorine (F). The radical may be derived from plasma of the etching gas by a remote plasma generation part in the substrate processing apparatus.

For example, the remote plasma generation part of the substrate processing apparatus generates plasma by using the etching gas. The etching gas may include $NF_3$, $H_2$, and $NH_3$ and include Aror He as the carrier gas.

The etching gas is inputted to the remote plasma generation part, and the remote plasma is generated by the plasma generation device. Next, a step of deriving the radical, including fluorine, from the generated remote plasma is performed. Ions cannot be discharged to the outside of the remote plasma generation part by an ion blocker installed between the remote plasma generation part and the substrate, only radical components, which do not have electrical polarities, pass through the ion blocker in this step. The radical includes fluorine (F) that is an element used for the etching process. The etching process is performed by supplying the radical including fluorine, e.g., $NH_4F$ to the substrate. In this case, the process pressure may be within a range of 3,000 to 5,000 mTorr during the etching process.

In the present disclosure, the substrate processing apparatus capable of performing both the deposition process and the etching process may be used.

Figure 8:
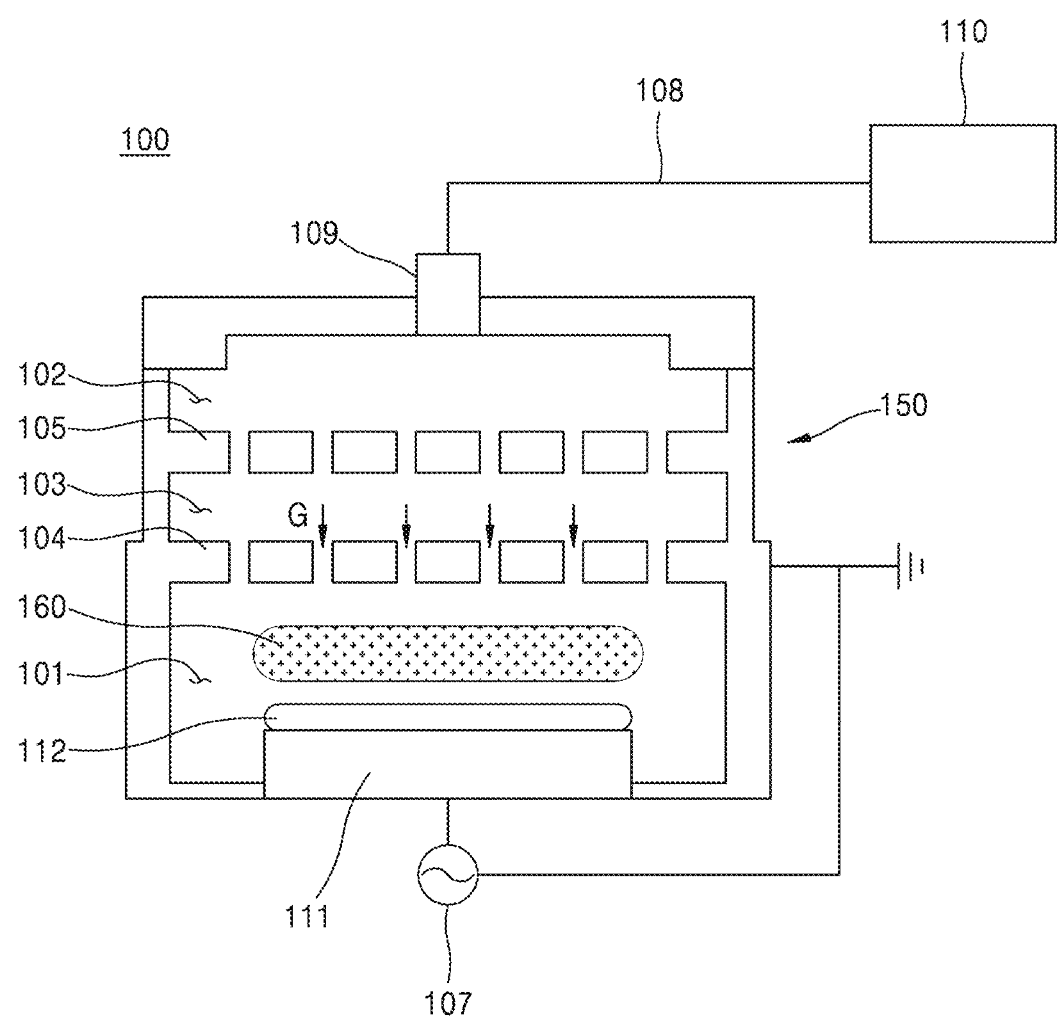
FIGS. 8 and 9 are views exemplarily illustrating a substrate processing apparatus capable of performing both a deposition process and an etching process.
Figure 9:
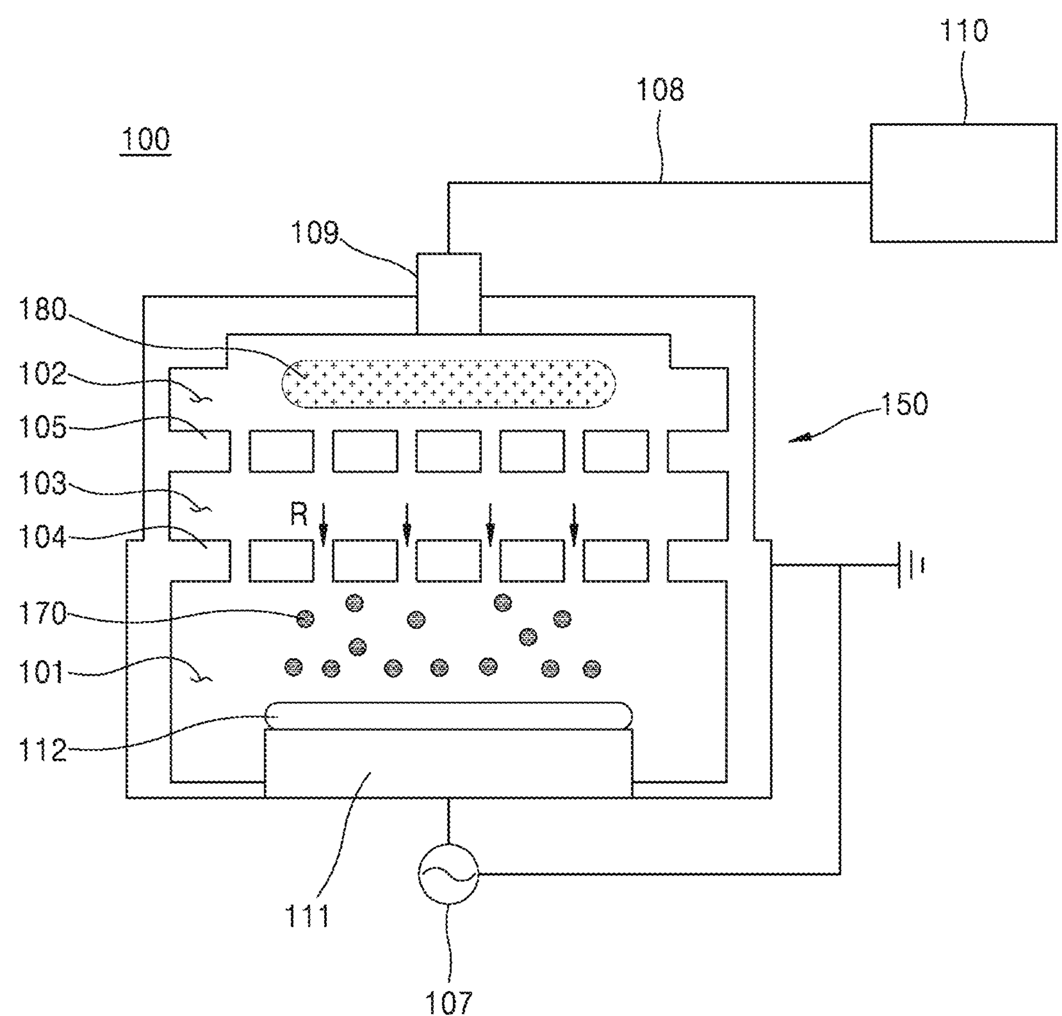
Figure 10:
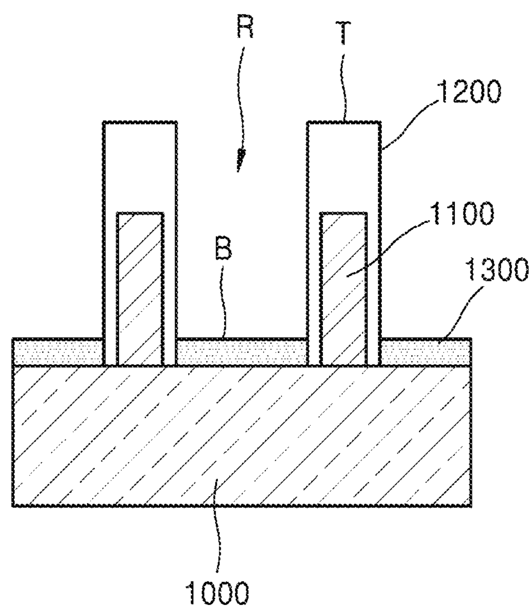
FIG. 10 is a view exemplarily illustrating a pattern structure in which lateral and top portions of a conductive pattern are surrounded by a silicon nitride.

FIGS. 8 and 9 are views exemplarily illustrating the substrate processing apparatus capable of performing both the deposition process and the etching process.

With reference to FIG. 8, a substrate processing apparatus 100 includes a chamber 150 configured to provide a sealed space therein, a chuck 111 disposed at a lower side of the chamber and configured such that a substrate 112 is mounted thereon, a gas supply unit 110 configured to supply a gas into the chamber 150 through a gas inlet 109 formed in a top portion of the chamber 150, a shower head 104 configured to uniformly distribute the gas G. which is supplied into the chamber 150, and supply the gas G to the substrate 112, and a power supply unit 107 configured to supply power in order to generate plasma from the gas supplied into the chamber 150. A space 101 between the shower head 104 and the chuck 111 is a space for generating plasma 160 by using the precursor gases in the deposition step or the etching step.

The chamber 150 provides a space in which a substrate processing process, such as the deposition process or the etching process, may be performed. The chamber 150 may be connected to a vacuum pump (not illustrated) and establish a vacuum ambiance in the sealed space therein.

The substrate 112, which is a processing target, may be accommodated and mounted on the chuck 111. For example, the chuck 111 may be an electrostatic chuck including a dielectric material and a metal electrode in the dielectric material and configured to fix the substrate 112 by using an electrostatic force generated when a voltage is applied to the metal electrode.

The gas supply unit 110 stores the precursor gas for the deposition process or the etching gas for the etching process and supplies the precursor gas or the etching gas to the chamber 150 through a delivery line 108.

The shower head 104 has a structure having a plurality of holes through which the gas may pass so that the gas, which is inputted to the chamber 150 through the gas inlet 109 from the gas supply unit 110, is uniformly supplied onto the substrate 112. The shower head 104 is disposed above the substrate 112.

The power supply unit 107 may have a structure in which one end thereof is connected to the chuck 111 and the other end thereof is connected to the grounded shower head 104. The power supply unit 107 may input power to generate plasma from the gas inputted to the chamber 150. For example, the inputted power may be RF power.

The substrate 112 is a plate-shaped material on which the semiconductor device is formed. Representative examples of the substrate 112 may include a silicon wafer, a compound semiconductor wafer, and the like.

The process of alternately and repeatedly performing the steps of depositing and etching the silicon nitride on one surface of the substrate 112 by using the substrate processing apparatus 100.

With reference to FIG. 8, for example, the precursor gas is inputted into the chamber 150 from the gas supply unit 110, the plasma 160 is generated in the plasma generation region 101, and then the silicon nitride may be deposited on the substrate 112 seated on the chuck 111 by means of the plasma-enhanced chemical vapor deposition. Examples of the precursor gas may include $SiH_4$ gas, $NH_3$ gas, and He gas. As another example. $SiH_4$ gas, $NH_3$ gas, $N_2$ gas, and He gas may be included.

After the deposition step is completed, the step of etching the silicon nitride deposited in the deposition step may be performed by stopping the input of the precursor gas used for the deposition process, inputting the etching gas, and then generating plasma. The etching gas may include $NF_3$ gas. For example, $NF_3$ gas, $NH_3$, and Ar gas may be inputted as the etching gas.

In the etching step of the present disclosure, the step of simultaneously etching the silicon nitride and the silicon oxide may etch the silicon nitride and the silicon oxide by using the radical derived from remote plasma.

FIG. 9 illustrates a step of performing the etching process by using remote plasma in the substrate processing apparatus.

With reference to FIG. 9, a remote plasma generation part 102 is formed above the shower head 104 in the chamber 150. An ion blocker 105 is disposed below the remote plasma generation part 102, and the ion blocker 105 allows only the radical having no electrical polarity to selectively pass therethrough without transmitting ions having electrical polarities. The remote plasma generation part 102 generates plasma 180 from the inputted etching gas by using the plasma generation device (not illustrated). The ions in the generated plasma cannot pass through the ion blocker 105, and the radical 170 having no electrical polarity selectively passes through the ion blocker 105 and is supplied to the substrate 112 through the shower head 104.

Hereinafter, experimental results are provided to help understand the present disclosure. These experimental results are provided for illustrative purposes only to help understand the present disclosure, and the present disclosure is of course not limited to the experimental results.

Pattern structures were formed on a silicon wafer so as to be used for experiments. Specifically, a silicon oxide was deposited on one surface of the silicon wafer. Next, a first silicon nitride was deposited, and then a hole-type recess region was formed by removing a partial region of the first silicon nitride by using an exposure process and an etching process. In this case, in the etching step for forming the hole-type recess region, a pattern structure was formed such that the first silicon nitride remained, the bottom portion was the first silicon nitride, and the silicon oxide was provided below the first silicon nitride. In the formed hole-type recess region, a diameter of an opening portion having a circular shape was 10 nm, and an aspect ratio (i.e., a value made by dividing a depth from the opening portion to a bottom portion of the recess region by a diameter of the opening portion) of the recess region including a cylindrical hollow empty space was 13.

The silicon wafer having the pattern structure was inputted to the substrate processing apparatus (see FIGS. 8 and 9) and seated on the chuck, and then the steps of depositing and etching the second silicon nitride were repeatedly performed in one cycle.

Figure 7:
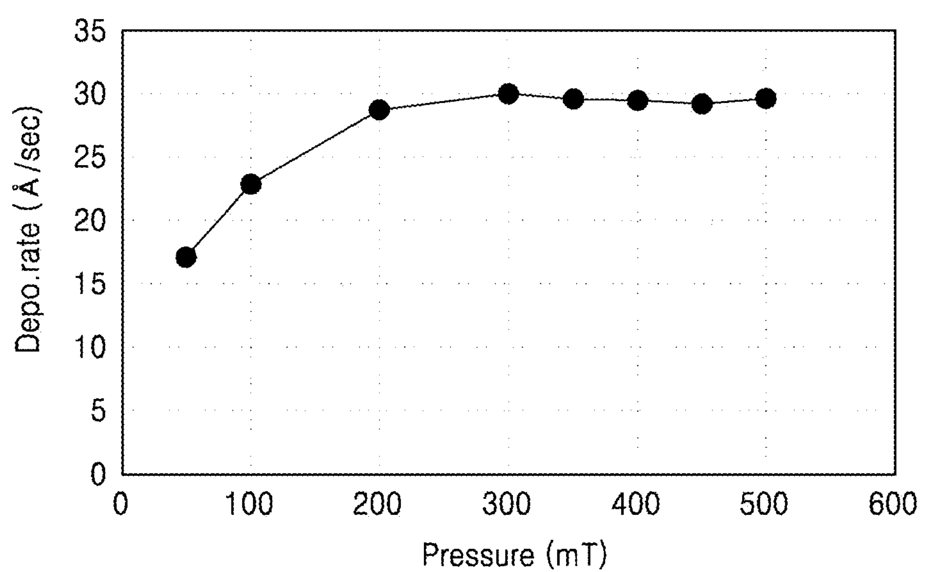
FIG. 7 is a graph illustrating a result of measuring a deposition rate with respect to a process pressure during a deposition process.

Table 1 shows deposition conditions for the second silicon nitride. In order to determine the deposition condition, a deposition rate (Depo. rate) was measured in advance while changing a process pressure to 50 to 500 mTorr in a state in which the remaining conditions, except for the process pressure condition, were maintained. FIG. 7 illustrates the result. With reference to FIG. 7, it can be ascertained that the deposition rate increases as the process pressure increases, but the deposition rate is maintained at a predetermined level after 200 mTorr. In the present disclosure, it was determined that the process pressure was preferred to be maintained to be as high as 100 mTorr or higher, e.g., 200 mTorr or higher because the deposition rate for the bottom portion needed to be decreased as much as possible in the deposition step. Table 2 shows a deposition condition in which the process pressure is maintained to be 200 mTorr.

Table 2 shows etching conditions for the second silicon nitride. In Table 2, Etching Condition 1 refers to a condition in which the second silicon nitride is etched, and Etching Condition 2 refers to a condition in which the second silicon nitride and the silicon oxide are simultaneously etched by using the remote plasma, i.e., a condition in which the etching selection ratio is 1. Power in Etching Condition 2 was power inputted to generate the remote plasma. In this case, the radical is selectively extracted by using the grounded ion blocker.

TABLE 1

| Classification | He (sccm) | $NH_3$ (sccm) | $SiH_4$ (sccm) | Process pressure (mTorr) | Power (W) | Chuck Temperature (° C.) |
|---|---|---|---|---|---|---|
| Deposition condition | 300 | 60 | 28 | 200 | 100 | 90 |

TABLE 2

| Classification | He (sccm) | $NF_3$ (sccm) | $NH_3$ (sccm) | $H_2$ (sccm) | Process Pressure (mTorr) | Power (W) |
|---|---|---|---|---|---|---|
| Etching condition 1 | 500 | 30 | 40 | — | 30 | 150 |
| Etching condition 2 | 500 | 220 | 450 | 250 | 4000 | 225 |

The first silicon nitride was deposited on the pattern structure under the condition shown in Table 1, and the etching process was performed under Etching Condition 1 shown in Table 2. After a time point at which the second silicon nitride on the bottom portion was determined as being removed completely, the deposition condition was maintained as the condition shown in Table 1, but the etching process was performed under Etching Condition 2.

According to a result of observing the pattern structure after the completion of the process in the chamber, it could be ascertained that the second silicon nitride, which constituted the bottom portion before being inputted to the chamber, and the silicon oxide provided below the second silicon nitride are removed completely, but a surface portion of the second silicon nitride was not etched.

The technical spirit of the present disclosure, which has been described above, is not limited by the aforementioned embodiment and the accompanying drawings, and it will be obvious to those skilled in the art to which the present disclosure pertains that various substitutions, modifications, and alterations may be made without departing from the technical spirit of the present disclosure.

What is claimed is:

1. A method of forming a pattern structure including a silicon nitride, the method comprising:

a step of providing, into a substrate processing apparatus, a substrate having one surface on which a pattern structure including a recess region in which an opening periphery portion and a bottom portion are made of a first silicon nitride is formed;

step (a1) a deposition step of depositing a second silicon nitride on the first silicon nitride so that a deposition thickness on the bottom portion has a smaller value than a deposition thickness on the opening periphery portion;

step (b1) an etching step of etching the second silicon nitride on the opening periphery portion by the thickness deposited in step (a1), etching and removing the second silicon nitride deposited in step (a1) on the bottom portion, and etching the first silicon nitride provided below the second silicon nitride; and a step of performing steps (a1) and (b1) in one cycle n times (n is a natural number equal to or larger than 1) until the first silicon nitride constituting the bottom portion is removed.

2. The method of claim 1, wherein the pattern structure further comprises a conductive pattern having lateral and top portions surrounded by the first silicon nitride.

3. The method of claim 1, wherein the deposition step in step (a1) is performed as plasma-enhanced chemical vapor deposition using a silicon precursor gas and a nitrogen precursor gas.

4. The method of claim 3, wherein the silicon precursor gas includes $SiH_4$, and the nitrogen precursor gas includes any one of or both $N_2$ and $NH_3$.

5. The method of claim 4, wherein a process pressure of the substrate processing apparatus in the deposition step is within a range of 100 to 500 mTorr.

6. The method of claim 4, wherein plasma generation power in the deposition step is within a range of 100 to 400 W.

7. The method of claim 1, wherein a deposition thickness of the second silicon nitride in the deposition step in step (a1) is within a range of 30 to 100 Å.

8. The method of claim 1, wherein the etching step in step (b1) is performed by using plasma of an etching gas.

9. The method of claim 8, wherein the etching gas includes $NF_3$ gas and $NH_3$ gas.

10. The method of claim 9, wherein a process pressure in the etching step is within a range of 20 to 50 mTorr.

11. The method of claim 1, wherein an aspect ratio of the recess region is within a range of 5 to 15.

12. The method of claim 1, wherein the pattern structure further comprises a layer made of a silicon oxide formed below the bottom portion, and wherein the method further comprises:

after the removal of the first silicon nitride on the bottom portion, step (c1) a deposition step of depositing the second silicon nitride on the first silicon nitride so that the deposition thickness on the bottom portion has a smaller value than the deposition thickness on the opening periphery portion;

step (d1) an etching step of etching the second silicon nitride on the opening periphery portion by the thickness deposited in step (c1), etching and removing the second silicon nitride deposited in step (c1) on the bottom portion, and etching the silicon oxide provided below the second silicon nitride; and a step of performing steps (c1) and (d1) in one cycle n times (n is a natural number equal to or larger than 1).

13. The method of claim 12, wherein the step of etching the silicon oxide in step (d1) is performed under an etching condition in which an etching selection ratio (ER1/ER2) made by dividing an etching rate ER1 for the silicon nitride by an etching rate ER2 for the silicon oxide is within a range of 0.8 to 1.2.

14. The method of claim 13, wherein the step of etching the silicon oxide is performed until the silicon oxide is removed.

15. The method of claim 12, wherein the etching step in step (d1) is performed by using a radical including fluorine and derived from remote plasma generated by using an etching gas in a remote plasma generation part of the substrate processing apparatus.

16. The method of claim 15, wherein the etching gas includes $NF_3$, $H_2$, and $NH_3$.

17. The method of claim 16, wherein a process pressure in the etching step is within a range of 3,000 to 5,000 mTorr.

18. A method of forming a pattern structure including a silicon nitride, the method comprising:

a step of providing, into a substrate processing apparatus, a substrate having one surface on which a pattern structure including a recess region in which an opening periphery portion and a bottom portion are made of a first silicon nitride is formed;

step (a2) a deposition step of depositing a second silicon nitride on the first silicon nitride so that the second silicon nitride is deposited on the opening periphery portion, and the second silicon nitride is not deposited on the bottom portion;

step (b2) an etching step of etching the second silicon nitride on the opening periphery portion by a thickness deposited in step (a2) and etching the first silicon nitride on the bottom portion; and a step of performing steps (a2) and (b2) in one cycle n times (n is a natural number equal to or larger than 1) until the first silicon nitride on the bottom portion is removed.

19. The method of claim 18, wherein the pattern structure further comprises a layer made of a silicon oxide formed below the bottom portion, and wherein the method comprises:

after the removal of the first silicon nitride on the bottom portion, step (c2) a deposition step of depositing the second silicon nitride on the first silicon nitride so that the second silicon nitride is deposited on the opening periphery portion, and the second silicon nitride is not deposited on the bottom portion;

step (d2) an etching step of etching the second silicon nitride on the opening periphery portion by a thickness deposited in step (a2) and etching the silicon oxide on the bottom portion; and a step of performing steps (c2) and (d2) in one cycle n times (n is a natural number equal to or larger than 1).

20. A method of forming a pattern structure including a silicon nitride, the method comprising:

a step of providing, into a substrate processing apparatus, a substrate having one surface on which a pattern structure including a recess region, in which an opening periphery portion and a bottom portion are made of a first silicon nitride, and including a layer formed below the recess region and made of a silicon oxide is formed;

step (a) a deposition step of depositing a second silicon nitride on the first silicon nitride so that the second silicon nitride is deposited or not deposited so that a deposition thickness on the bottom portion has a smaller value than a deposition thickness on the opening periphery portion;

step (b) an etching step including a step of etching the second silicon nitride on the opening periphery portion by the thickness deposited in step (a) and etching the first silicon nitride on the bottom portion;

a step of performing steps (a) and (b) in one cycle n times (n is a natural number equal to or larger than 1) until the first silicon nitride on the bottom portion is removed;

step (c) a deposition step of depositing the second silicon nitride on the first silicon nitride so that the second silicon nitride is deposited or not deposited so that the deposition thickness on the bottom portion has a smaller value than the deposition thickness on the opening periphery portion;

step (d) an etching step of etching the second silicon nitride by a first thickness and etching the silicon oxide under the bottom portion; and a step of performing steps (c) and (d) in one cycle n times (n is a natural number equal to or larger than 1) until the silicon oxide under the bottom portion is removed, wherein the step of etching the silicon oxide in step (d) is performed as an etching process using a radical including fluorine under an etching condition in which an etching selection ratio (ER1/ER2) made by dividing an etching rate ER1 for the silicon nitride by an etching rate ER2 for the silicon oxide is within a range of 0.8 to 1.2, and wherein a process pressure is within a range of 3,000 to 5,000 mTorr.

* * * * *